US010739665B2

(12) United States Patent
Smalley

(10) Patent No.: US 10,739,665 B2
(45) Date of Patent: Aug. 11, 2020

(54) STRUCTURES FOR MODIFYING LEAKY MODE LIGHT

(71) Applicant: Brigham Young University, Provo, UT (US)

(72) Inventor: Daniel Smalley, Provo, UT (US)

(*) Notice: Subject to any disclaimer, the term of this patent is extended or adjusted under 35 U.S.C. 154(b) by 0 days.

(21) Appl. No.: 16/032,951

(22) Filed: Jul. 11, 2018

(65) Prior Publication Data
US 2018/0375490 A1 Dec. 27, 2018

Related U.S. Application Data

(63) Continuation-in-part of application No. 15/955,670, filed on Apr. 17, 2018, now abandoned.

(60) Provisional application No. 62/486,326, filed on Apr. 17, 2017.

(51) Int. Cl.
G02F 1/335 (2006.01)
G02B 6/02 (2006.01)
G02B 6/122 (2006.01)
G02F 1/125 (2006.01)
H03H 9/02 (2006.01)
H01S 3/094 (2006.01)
G02B 27/01 (2006.01)
G02F 1/01 (2006.01)

(52) U.S. Cl.
CPC ......... *G02F 1/335* (2013.01); *G02B 6/02076* (2013.01); *G02B 6/1223* (2013.01); *G02F 1/125* (2013.01); *G02B 27/017* (2013.01); *G02F 1/0126* (2013.01); *H01S 3/094046* (2013.01); *H03H 9/02543* (2013.01)

(58) Field of Classification Search
None
See application file for complete search history.

(56) References Cited

U.S. PATENT DOCUMENTS

2016/0286204 A1* 9/2016 Grata .................. G02F 1/33

* cited by examiner

Primary Examiner — Jerry Rahll
(74) Attorney, Agent, or Firm — Strong & Hanni, P.C.; Joseph Shapiro

(57) ABSTRACT

A method and system for using laser-induced structures to direct light to exit the bottom of a leaky mode device, and further to divide leaky mode light into multiple orders, and to implement one or more pulsing/strobing patterns such that a field of view is increased for a viewer, or the view zone is increased for a viewer. A leaky mode device may comprise a substrate, a surface acoustic wave ("SAW") transducer, a waveguide having a higher refractive index than the substrate, an input region for input light, and laser induced structures such as grating. The SAW transducer may be positioned on a top surface of the substrate, and may be configured to emit a SAW wave to propagate across the substrate. The waveguide may be positioned below the SAW. The input wave region may be configured to couple light onto the waveguide. When light is coupled onto the waveguide, the refractive index may change such that the light in the waveguide exits the waveguide as leaky mode light and interacts with the laser-induced grating, which is below the waveguide. The laser-induced grating is configured to divide the leaky mode light into multiple orders, each bent at a different angle.

20 Claims, 18 Drawing Sheets

STRUCTURES FOR MODIFYING LEAKY MODE LIGHT

BACKGROUND OF THE INVENTION

Leaky mode systems may be used for holographic video, e.g., flat-screen, scanned aperture, and near-eye holographic video systems. In a leaky mode system, which generally comprises multiple leaky mode devices, surface acoustic waves ("SAW") for a leaky mode device are generated by a transducer that encodes electrical information as a pattern of surface acoustic waves. This surface acoustic wave pattern acts both to mode couple light so that it is no longer guided and also to encode the light with holographic information. The leaky mode light propagates to form part or all of a holographic image.

One of the shortcomings in leaky mode light systems is that light exits the edge, rather than the bottom, of the device. This means that the device output aperture depends on the device thickness. Larger apertures mean thicker, more expensive, harder-to-process devices. Because in existing leaky light mode devices light exits the edge, but not the bottom, such devices can be combined only in one-dimensional arrays (which might themselves be one dimensional arrays). Otherwise, the light exit would be blocked. FIG. 6 shows an example of a one-dimensional array 600 of leaky mode devices 605, with respective transducers 610, respective SAWs 620, and respective light 630 exiting from side of leaky mode device 605n.

Additionally, fabricating gratings in leaky mode devices can be difficult and expensive when gratings have high spatial frequency. A grating in a leaky mode device is a periodic structure, usually etched into the bottom surface of the leaky mode substrate. The period of these gratings is typically around 300 nm. This grating structure takes leaky mode light traveling at approximately 10 degrees internally and bends it to 90 degrees as it exits the bottom surface of the device substrate. Standard photolithographic processes can be used to create patterns down to 1 μm features size. However, output gratings in lithium niobate meant to out-couple leaky mode light typically have grating periods around 300 nm. At this feature size, interference lithography, contact lithography, or more commonly, ebeam lithography must be used. But these fabrication techniques are difficult, expensive, and suffer from other shortcomings. Interference lithography has limited control of the grating pattern (only uniform gratings). Contact lithography requires special, thin, fragile flex masks that degrade with use. Ebeam lithography writes the pattern serially and is considered a low-throughput, high cost technique.

Another problem is that a bottom exit grating will reduce the field of view of a leaky mode near-eye display as compared with an edge-exit leaky mode display. Leaky mode modulators change the angle of light during mode conversion by adding or subtracting the spatial frequency of a surface acoustic wave to the spatial frequency of the light in the guide input mode. A grating output coupler adds or subtracts spatial frequencies in opposition to the grating formed by surface acoustic waves, essentially undoing some of the angular deflection.

Additionally, even when bottom exit gratings are used to direct and guide light to exit out the bottom of a leaky mode device, when a user moves it ay appear that that a virtual point is shifting with the user, rather than appearing to the user that the virtual point remains at the same point in space regardless of how a user has shifted, What is needed is improvements to leaky mode devices to facilitate non-grating light exit from the bottom of a leaky mode device and/or to mitigate and/or overcome edge exit for leaky mode light devices, and further to mitigate obstacles and other issues associated with bottom exit in leaky mode devices.

BRIEF SUMMARY OF THE INVENTION

A system and apparatus for improvements to leaky mode devices are disclosed.

In one embodiment, a structure-modified leaky mode device ("SMLMD") may comprise a leaky mode device that includes light deflection structures in the interior of the leaky mode device to deflect, i.e., redirect, leaky mode light, i.e., light from an illuminated SAW, toward the bottom of the leaky mode device before the light translates laterally from the side edges of the leaky mode device. The structures may also divide the light from an illuminated SAW into different orders. In general, each order is light bent at a different angle. Such structures may be gratings, mirrors, prisms, or similar structures. These structures may be laser-induced, which allows for structures internal to the leaky mode device. The structures may also be fabricated on the surface of a leaky mode device.

In one embodiment, an SMLMD may comprise a substrate, a SAW (surface acoustic wave) transducer, input region light, a waveguide, guided light, and structures 160. The Guided light may guided in the waveguide under the SAW.

When the transducer generates a SAW, the SAW propagates across the surface of the leaky mode device. If the SAW is illuminated by strobed light from the input region light, leaky mode light leaks into the substrate and interacts with the structures. In one embodiment, the structures divide the light into multiple orders, each bent at a different angle.

If strobing is timed properly, the orders into which leaky mode light are divided may be used to generate an increased field of view and/or an increased view zone.

DETAILED DESCRIPTION OF THE INVENTION

Figure 1:
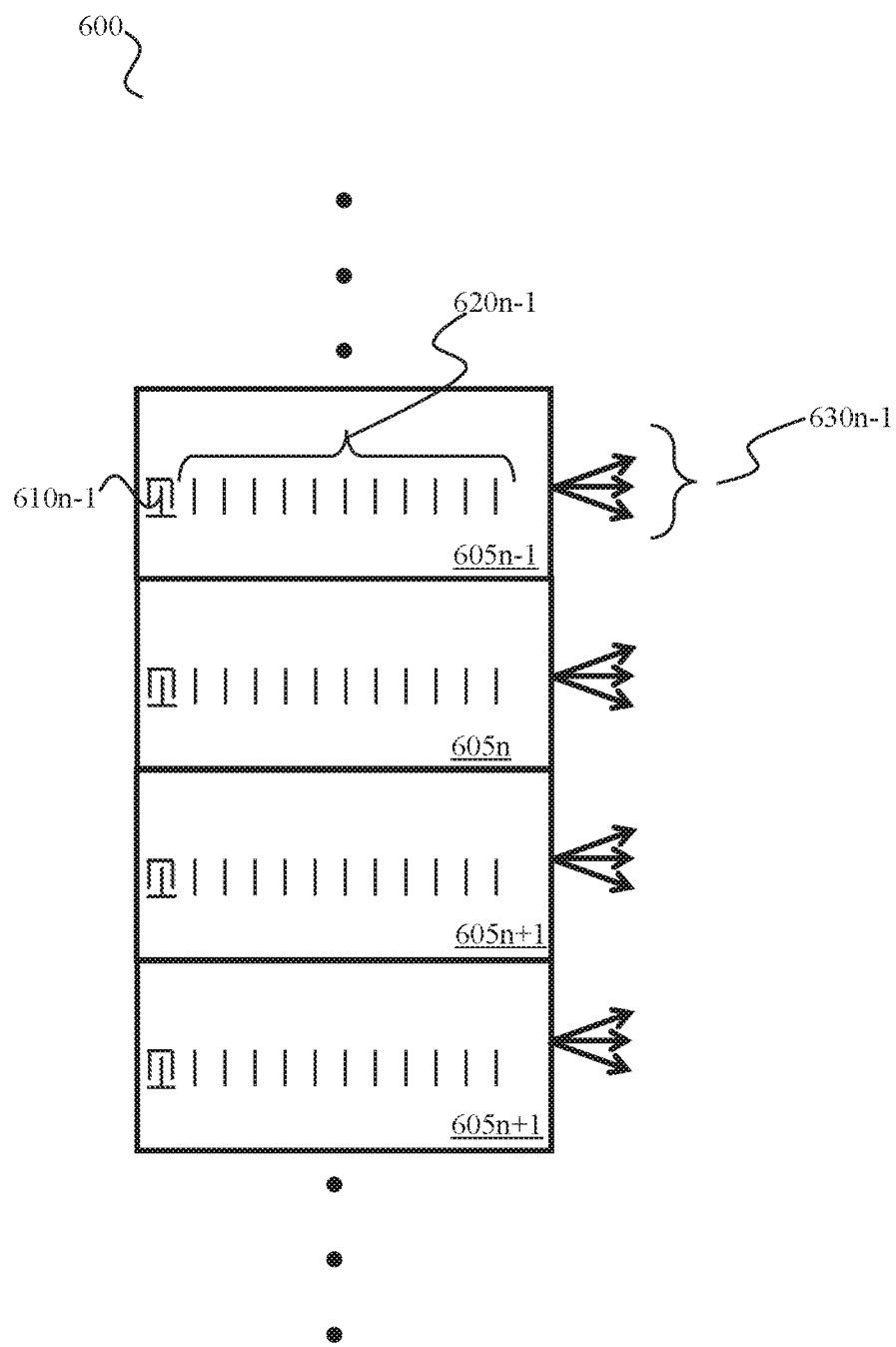
FIG. 1 shows a top view of a one-dimensional array of leaky mode devices.

This Application claims priority as a continuation-in-part to U.S. Non-provisional application Ser. No. 15/955,670, titled "Structures for Modifying Leaky Mode Light," the first inventor of which is Daniel Smalley, which was filed on Apr. 17, 2018, and which in turn claims priority to U.S. Provisional Application No. 62/486,326, titled "Structures for Modifying Leaky Light Mode," the first inventor of which is Daniel Smalley, which was filed on Apr. 17, 2017, and which is incorporated herein by reference in its entirety.

A system and method are disclosed for using structures to redirect leaky mode light to bottom exit instead of side exit, and further to split light from illuminated SAWs into different orders, and further to overcome and/or mitigate drawbacks associated with bottom exit leaky mode light for flat-screen and near-eye architectures.

Table of Reference Numbers from Drawings:

The following table is for convenience only, and should not be construed to supersede any potentially inconsistent disclosure herein.

| Reference Number | Description |
|---|---|
| 100 | leaky mode device (SMLMD) |
| 101 | bottom of leaky mode device |
| 102 | side of leaky mode device |
| 105 | substrate |
| 110 | SAW transducer |
| 120 | SAW moving from left to right |
| 121 | SAW moving from left to right |
| 125 | direction of propagation of SAW |
| 127 | redirected leaky mode light |
| 130 | input light |
| 140 | waveguide |
| 150 | guided light |
| 160 | structures |
| 170a-b | light exiting side edge of substrate |
| 180a | order = −3 light after light from illuminated SAW is divided by structures into multiple orders |
| 180b | order = −2 light after light from illuminated SAW is divided by structures into multiple orders |
| 180c | order = −1 light after light from illuminated SAW is divided by structures into multiple orders |
| 180d | order = 0 light after light from illuminated SAW is divided by structures into multiple orders |
| 180e | order = 1 light after light from illuminated SAW is divided by structures into multiple orders |
| 202 | structures (medium periodicity) |
| 204 | structures (high periodicity) |
| 206 | structures (low periodicity) |
| 208 | structures (chirp pattern) |
| 212 | channel-specific structures including pulsing |
| 214 | channel-specific structures including pulsing |
| 216 | channel-specific structures including pulsing |
| 218 | channel-specific structures including pulsing |
| 305 | direction of propagation of SAW waves through substrate |
| 310 | first launched SAW |
| 311 | leaky mode light resulting from interaction between SAW 310 and input light |
| 320 | second launched SAW |
| 321 | leaky mode light resulting from interaction between SAW 320 and input light |
| 330 | high angle |

-continued

| Reference Number | Description |
|---|---|
| 340 | small diffraction angle |
| 350 | uniform laser-induced grating |
| 360a-d | higher orders of diffracted light |
| 405 | leaky mode channel |
| 410 | diffuser |
| 420a-b | lenslets |
| 425a-b | leaky mode light |
| 600 | one-dimensional array of leaky mode devices |
| 605n | leaky mode device |
| 610n | transducer |
| 620n | SAW |
| 630n | light exiting from side of leaky mode device 605n |
| 710 | virtual image point |
| 720 | structure(s) |
| 721 | pulsed SAW at time $t_1$ |
| 722 | pulsed SAW at time $t_2$ |
| 723 | pulsed SAW at time $t_3$ |
| 731-34 | redirected light |
| 737 | leaky mode light resulting from interaction of SAW 721 with input light 130 |
| 740 | viewer |
| 740a | viewing position 1 |
| 740b | viewing position 2 |
| 740c | viewing position 3 |
| 750 | direction of SAW propagation across leaky mode device |
| 805a-n | virtual image points |
| 806a-n | left ray for user perception of virtual point 805a-n |
| 807a-n | right ray for user perception of virtual point 805a-n |
| 808a-n | left ray of light associated with SAWs 821a-n |
| 809a-n | right ray of light associated with SAWs 821a-n |
| 810 | viewer |
| 820 | structure(s) |
| 821a-n | SAWs associated with virtual points 805a-n |
| 822 | SAW at time $t_2$ |
| 823 | SAW at time $t_3$ |
| 860 | redirected light |

A system and method arc: disclosed for using structures to redirect leaky mode light to facilitate bottom exit for light in leaky mode light devices used for flat-screen and near-eye architectures, holographic video architectures, as well as other applications of leaky mode light devices. The system and method disclosed herein are further useful for splitting light from illuminated SAWs into different modes to facilitate, e.g., increased view angle and increased field of view in a bottom exit leaky mode apparatus. As used herein, "leaky mode device" and "leaky mode light device" are equivalent. Bottom exit in leaky mode devices enables tiling, i.e., two-dimensional arrays, because light may exit the bottom of a leaky mode device even if the sides of the leaky mode device are blocked by other leaky mode devices in a two-dimensional array or tiling arrangement of leaky mode devices.

The system disclosed herein shall be referred to below as a "Structure-Modified Leaky Mode Device: (SMLMD). In general, bottom exit is facilitated using grating or mirror structures on the surface of or internal to a leaky mode device.

In one embodiment, a SMLMD may comprise a leaky mode device that includes light deflection structures in the interior of the leaky mode device to deflect, i.e., redirect, leaky mode light, i.e., light from an illuminated SAW, toward the bottom of the leaky mode device before the light translates laterally from the side edges of the leaky mode device. The structures may also divide the light from an illuminated SAW into different orders. In general, each order is light bent at a different angle. Such structures may be gratings, mirrors, prisms, or similar structures. These structures may be laser-induced, which allows for structures internal to the leaky mode device. The structures may also be fabricated on the surface of a leaky mode device.

Deflecting or redirecting leaky mode light through the bottom of a leaky mode device allows a viewer to see the output directly below the interaction region. Dividing light from an illuminated SAW into different modes allows for creating an increased view zone and and/or an increased field of view.

Figure 2A:
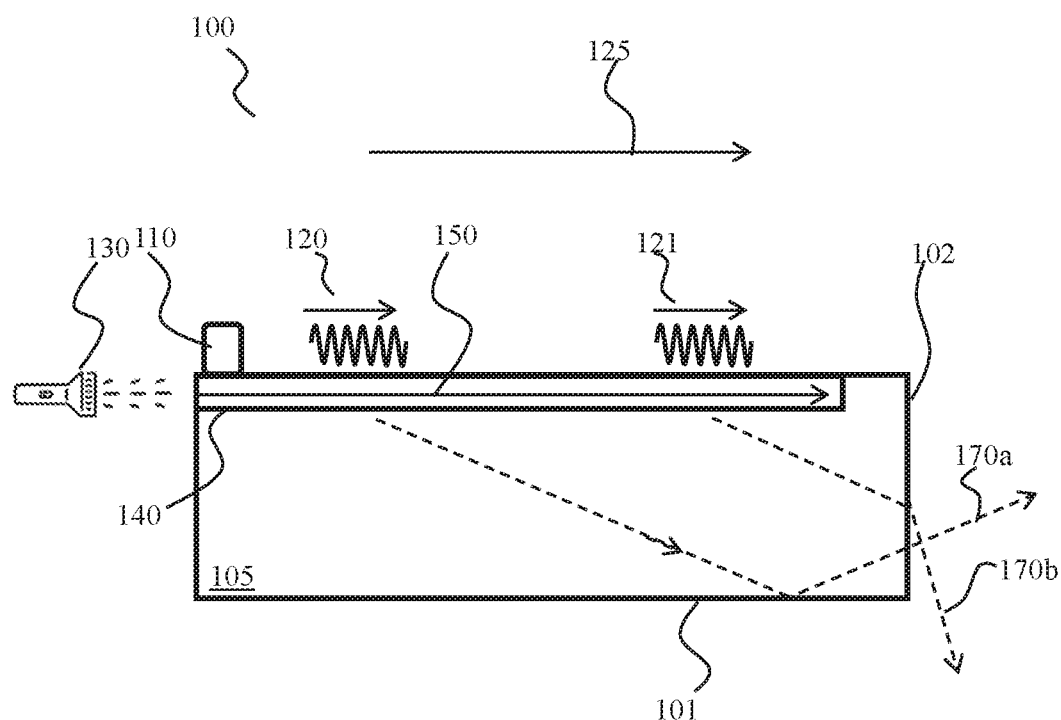
FIG. 2a illustrates a leaky mode device without structures as described herein.
Figure 2B:
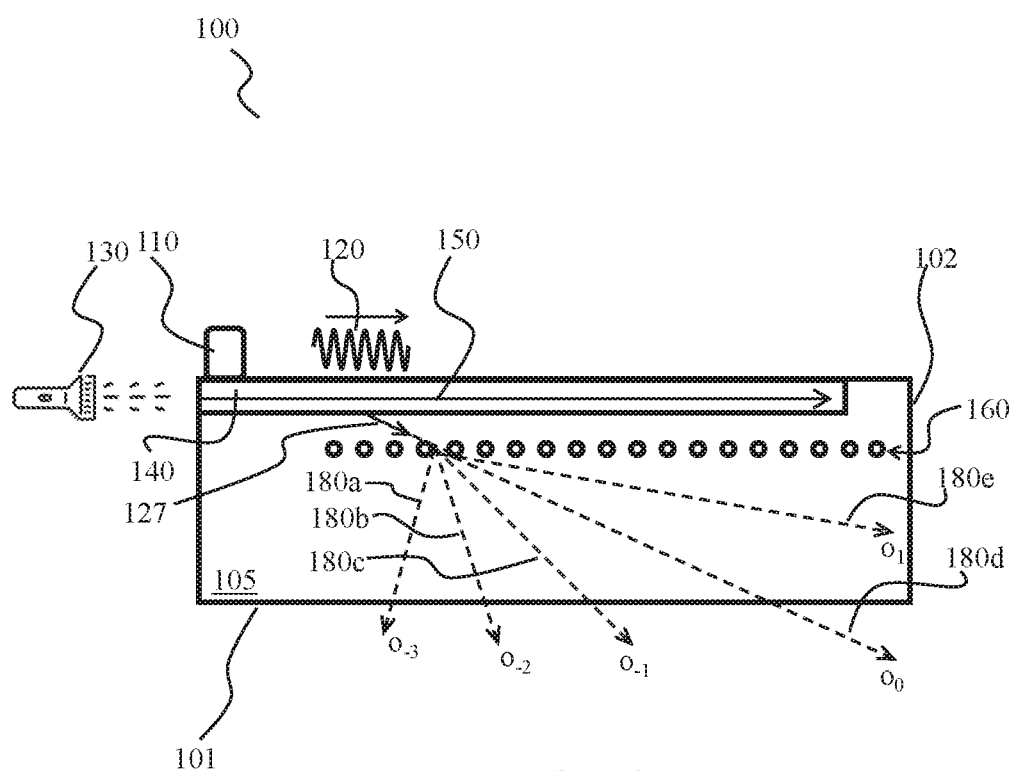
FIG. 2b illustrates a leaky mode device including structures as described herein.

In one embodiment, as shown in FIG. 2b, SMLMD 100 (which may also be referred to as a "leaky mode modulator" or a "leaky mode channel") may comprise substrate 105, SAW (surface acoustic wave) transducer 110, input region light 130, waveguide 140, guided light 150, and structure 160. Guided light 150 is guided in waveguide 140 under SAW 120.

In one embodiment, waveguide 140 is a part of the substrate that has been modified to have a higher refractive index. For example, in one embodiment, waveguide 140 may be the same material as substrate 105, but waveguide 140 may have been modified by proton exchange to create a waveguide region to increase its refractive index. The increased refractive index may apply for only one polarization, so that when mode-coupling occurs, resulting in a polarization change, waveguide 140 effectively no longer exists, and light 150 leaks into substrate 105.

In one embodiment, a laser-induced structured may be created by a femtosecond laser beam pulse.

SAW 120 and light in waveguide 140 may move collinearly or contra-linearly. The system works similarly if the light and the acoustic waves are moving together, i.e., collinearly, or in opposite directions, i.e., contra-linearly. As shown in FIG. 2b, SAW 120 and light 150 from input light 130 are moving collinearly. Both are moving left-to-right.

As shown in FIG. 2b, and described herein, SAW transducer 110 generates surface acoustic wave (SAW) 120, which may propagate across the surface of substrate 105.

As shown in FIG. 2b, waveguide 140 is configured to guide light 150. Light 150 may be coupled onto waveguide 140 from air or from substrate 105 by grating, prism, or by edge coupling, or some other method in light input region 130. As described herein above, because waveguide 140 has a higher refractive index than the refractive index of substrate 105, light 150 tends to remain in and be guided by waveguide 140. However, when light 150 in waveguide 140 interacts with SAW 120, and mode coupling occurs, along with a polarization change and associated loss of the increased refractive index, waveguide 140 effectively no longer exits and/or acts as a waveguide 140, and light 150 leaks into substrate 105.

FIG. 2b shows an example of light 150 interacting with SAW 120. When light 150 interacts with SAW 120, i.e., by "colliding" when SAW 120 above light 150, the leaked light from the interaction interacts with grating 160, thereby redirecting light 150 and dividing light 150 into multiple orders.

FIG. 2a shows an example of a leaky mode device without structures as disclosed herein. As shown in FIG. 2b, without structures as described herein, light paths 170a and 170b exit from side 102 of substrate 105 and are not divided into multiple orders.

As shown in FIG. 2b, the leaked light from the interaction between SAW 120 and light 150 is directed in a downward direction. In one embodiment, if SAW 120 is moving left-to-right and light 150 is moving left-to-right, then the interaction between SAW 120 and light 150 may result in leaked light moving downward and to the left, as shown by leaky mode light 127 in FIG. 2b.

As shown in FIG. 2b, structures 160 may interact with leaky mode light 170 to divide leaky mode light into multiple orders 180a-e. An order is a redirection of divided leaky mode light 127. Each order represents a redirection of leaky mode light 127 at a different angle. For example, as shown in FIG. 2b, structures 160 may divide leaky mode light 127 into order 180a (the minus 3 order), order 180b (the minus 2 order), order 180c (the minus 1 order), order 180d (the 0 order), and 180e (the plus 1 order). The 0 order represents the order that travels in the same direction as leaky mode light 127. The negative orders represent orders that are offset from the 0 order in the direction opposite the direction in which SAW 120 is traveling. The positive orders represent orders that are offset from the 0 order in the same direction in which SAW 120 is traveling.

Structures 160 may include thin or thick gratings, holographic structures, interfaces, bragg mirrors, prisms, lenses, spheres, or other structures.

Normally, the viewer would also see scatter from waveguide 140. This scatter can be reduced, however, by using a polarizer to eliminate noise or by using a low-loss waveguide such as a reverse proton exchange waveguide or a soft proton exchange waveguide.

In one alternate embodiment, the redirection structures 160 in a leaky mode device may comprise two (or more) gratings instead of one grating. By using multiple gratings, e.g., two gratings, the gratings can be of lower spatial frequency and may therefore be easier and less expensive to manufacture because the features of such gratings will be larger. Such gratings may be laser-induced.

If the gratings are Bragg gratings, then only one order results. Light passing through a thin grating will create several outputs, each at a different angle. Beams at angles higher than the illumination beam are called positive orders and those below the illumination beam are called lower orders. The spacing of the grating determines the angular separation of the modes. If the gratings are not Bragg gratings but are instead Raman Nath gratings or thin gratings, then many orders result from the use of such gratings. Although having multiple orders results in loss of power for all of the multiple order, and also results in the complication of having many simultaneous light beams instead of one, an embodiment with multiple orders results in beneficial increased filed-of-view in near-eye displays.

One embodiment may employ two gratings for bottom exit. In such an embodiment, the first grating may be used to create multiple orders and to select the angular separation of the multiple orders. The second grating may be used to rotate the orders toward the viewer. By carefully adjusting (1) the separation between the surface acoustic wave train that creates the leaky modes, (2) the distance to the first grating, and the distance to the second grating, the field of view for a viewer may be increased. Using this approach results in creation of a new version of a holographic image that has been rotated to a different angle and is visible to a viewer different time. The aggregate result of these orders is a wide field of view.

Using more than two gratings may modify the angle and potentially increase the number of orders.

In one embodiment, instead of including a grating for bottom exit, a leaky mode device may include a laser-induced mirror array. This approach avoids reduction of angular scan because the momentum of the light is not changed. Such an approach is viable for near eye applications, holographic video, as well as other leaky mode applications.

Figure 3A:
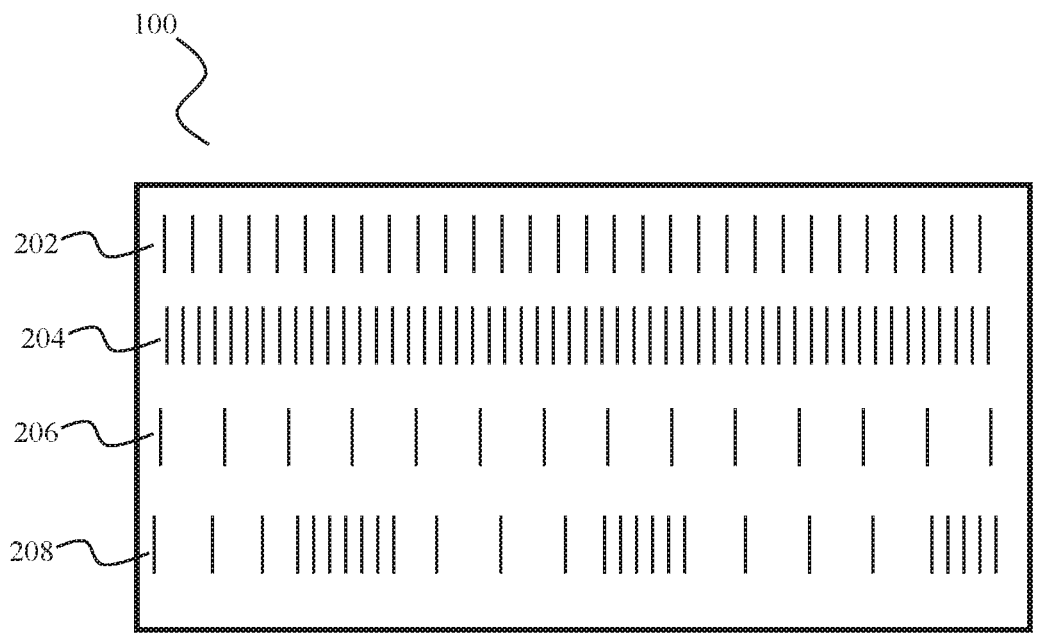
FIG. 3a shows a leaky mode device in which multiple channels have varying frequencies.
Figure 3B:
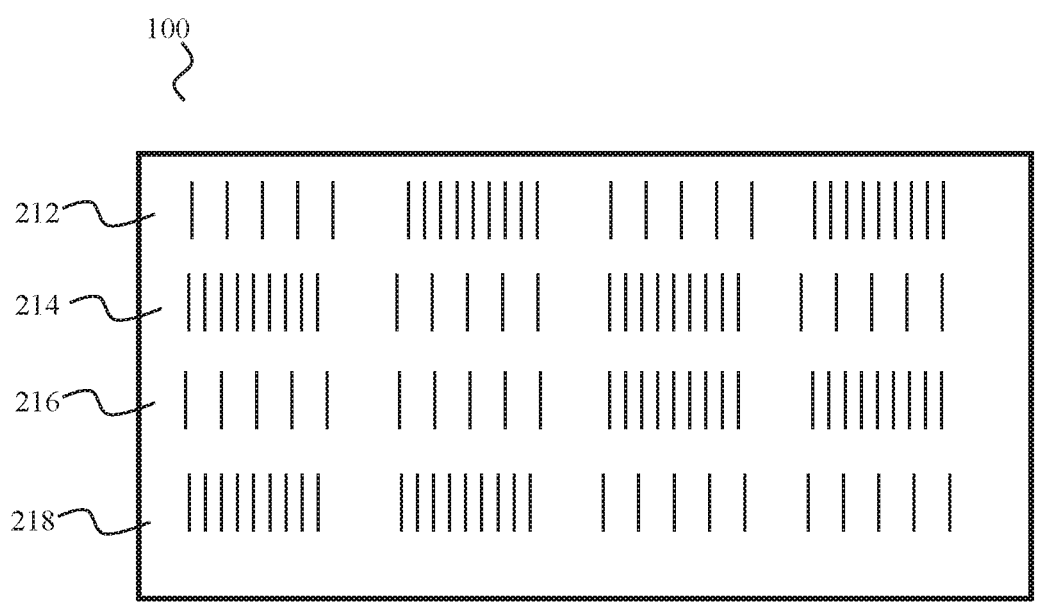
FIG. 3b shows a leaky mode device in which multiple channels have varying frequencies.

In one alternate embodiment, as shown in FIGS. 3a and 3b, SMLMD 100 may be a multichannel leaky mode device. For example, FIG. 3a shows a bottom perspective cross section view SMLMD 100 that has four leaky mode channels respective structures 202, 204, 206, and 208 beneath each of the four leaky mode channels. Structures 202, 204 206, and 208 may be located beneath a first leaky mode channel, a second leaky mode channel, a third leaky mode channel, and a fourth leaky mode channel, respectively.

As shown in FIG. 3a, structures 202, 204, 206, and 208 may have differing periodicities or spatial frequencies, or may differ from each other in other patterns, or may arbitrarily differ from each other. As shown in FIG. 3a, structure 202 may have a medium periodicity, structure 204 may have a high periodicity, structure 206 may have a low periodicity, and structure 208 may have a chirped periodicity pattern.

FIG. 3b shows a bottom-perspective cross section view of multichannel SMLMD 100 in an alternate embodiment in which structures 212, 214, 216, and 218 vary along individual channels, and in which pulsing may be used to get the leaky mode output to address particular structure regions. For example, structures 212, which may correspond to and be below a first leaky mode channel in SMLMD 100, may begin (from left to right) with a low periodicity pulse and alternate between a low periodicity pulse and a high periodicity pulse. Structures 214, which may correspond to and be below a second leaky mode channel in SMLMD 100, may, begin (from left to right) with a high periodicity pulse and alternate between a high periodicity pulse and a low periodicity pulse. Structures 216, which may correspond to and be below a third leaky mode channel in SMLMD 100, may begin (from left to right) with two low periodicity pulses and alternate between two low periodicity pulses and two high periodicity pulses. And structures 216, which may correspond to and be below a third leaky mode channel in SMLMD 100, may begin (from left to right) with two high periodicity pulses and alternate between two high periodicity pulses and two low periodicity pulses.

Figure 4A:
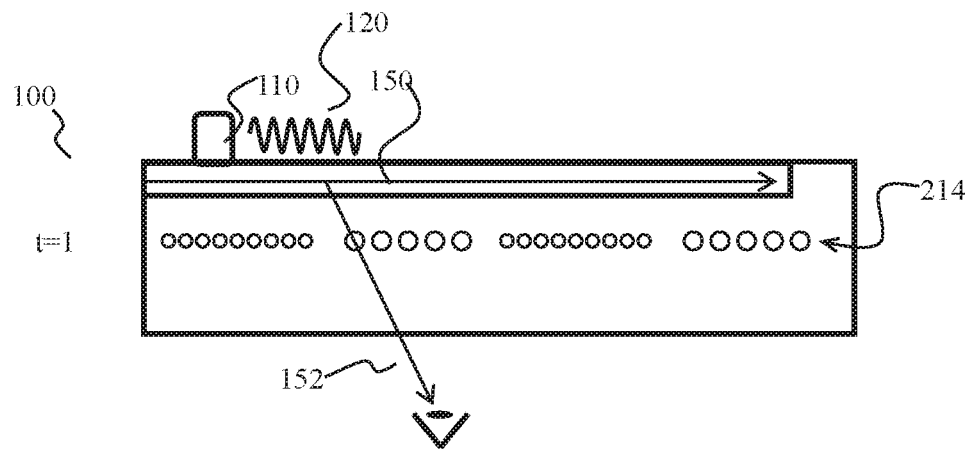
FIG. 4a shows a cross section of a leaky mode device in which a SAW is propagating across the surface.
Figure 4B:
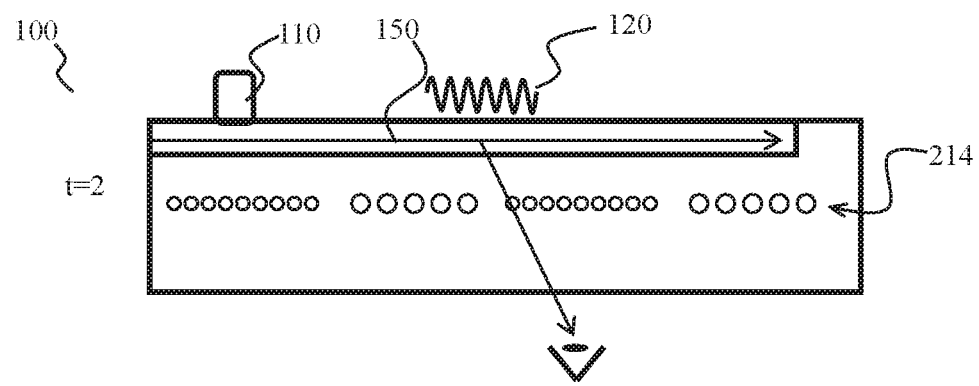
FIG. 4b shows a cross section of a leaky mode device in which a SAW is propagating across the surface.
Figure 4C:
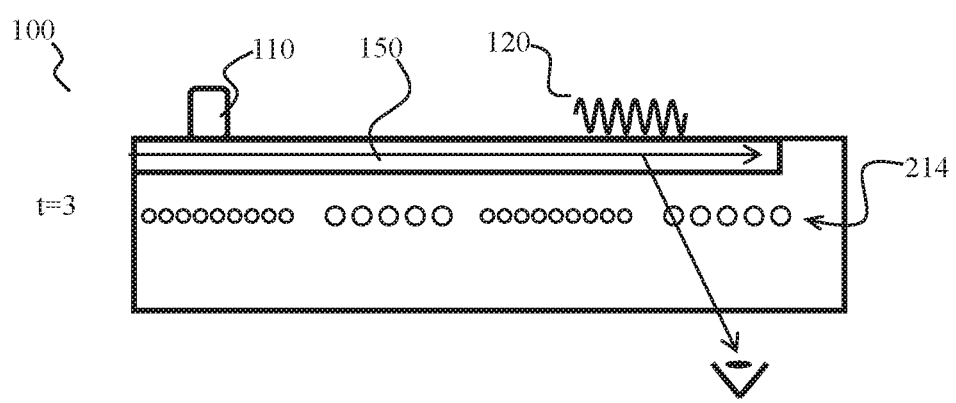
FIG. 4c shows a cross section of a leaky mode device in which a SAW is propagating across the surface.

FIGS. 4a, 4b, 4c show side-perspective cross section views of multichannel SMLMD 100 corresponding to structures 214 at $t_2$, and $t_3$ respectively. FIGS. 4a, 4b, and 4c show how pulsing SAW 120 at times $t_1$, $t_2$, and $t_3$, as SAW 120 propagates from left to right across surface of leaky mode device 100, may result in the leaky mode light from SAW 120 interacting with different portions for structures 214.

Figure 5:
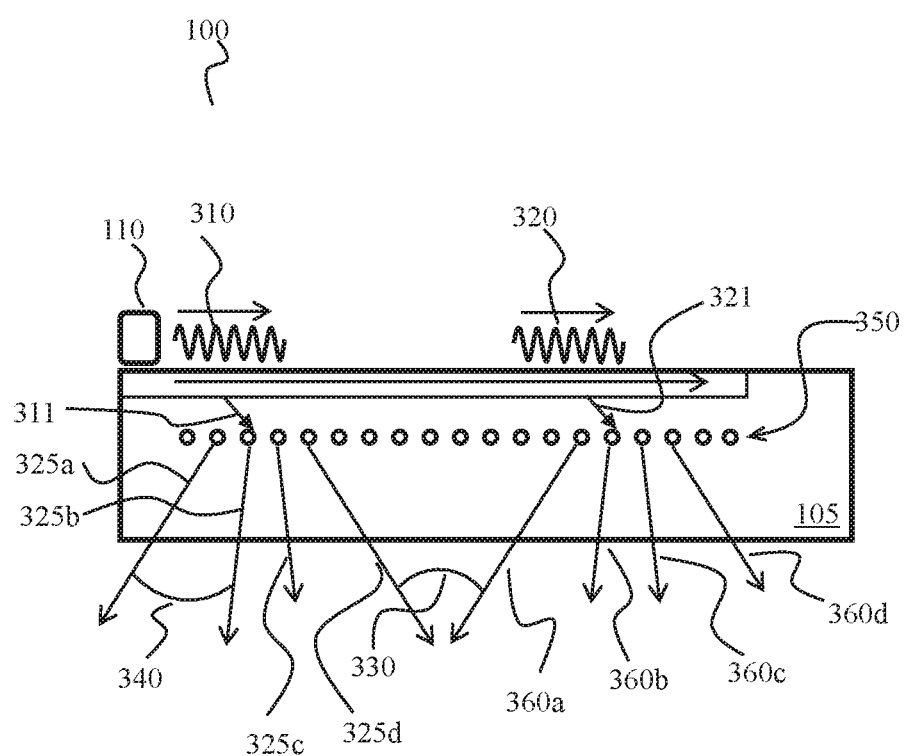
FIG. 5 shows how structures may divide leaky mode light from an illuminated SAW into multiple orders.

In another alternate embodiment, as shown in FIG. 5, structures 350 in SMLMD 100 may split a single input beam into multiple beams, e.g., a grating may give rise to multiple orders. These orders may be combined, e.g., using light pulsing with SAWs 310 and 320, to create high-angle information not contained in light from the original leaky mode.

Figure 8A:
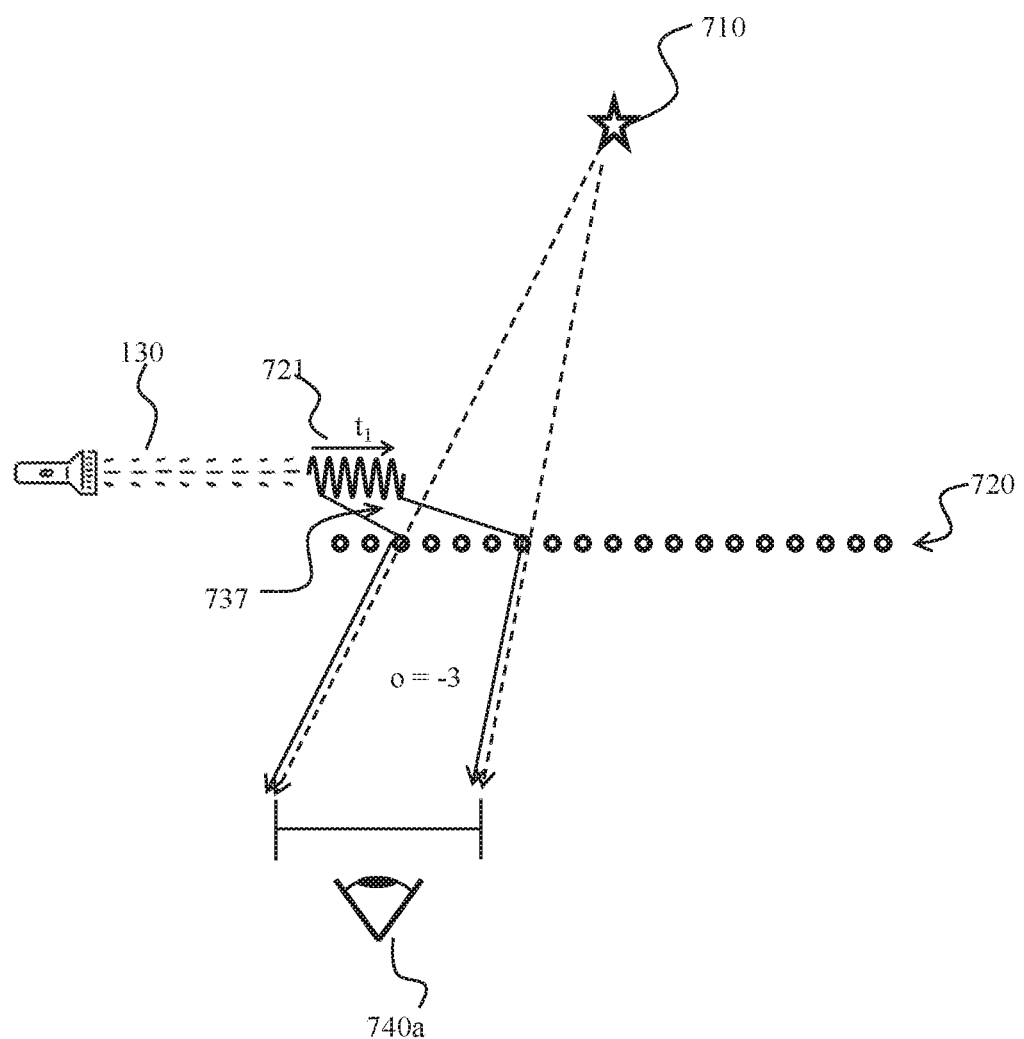
FIGS. 8a-8c show how the multiple orders into which structures may divide light from an illuminated SAW may be used to increase the view zone by strobing at different times.
Figure 8B:
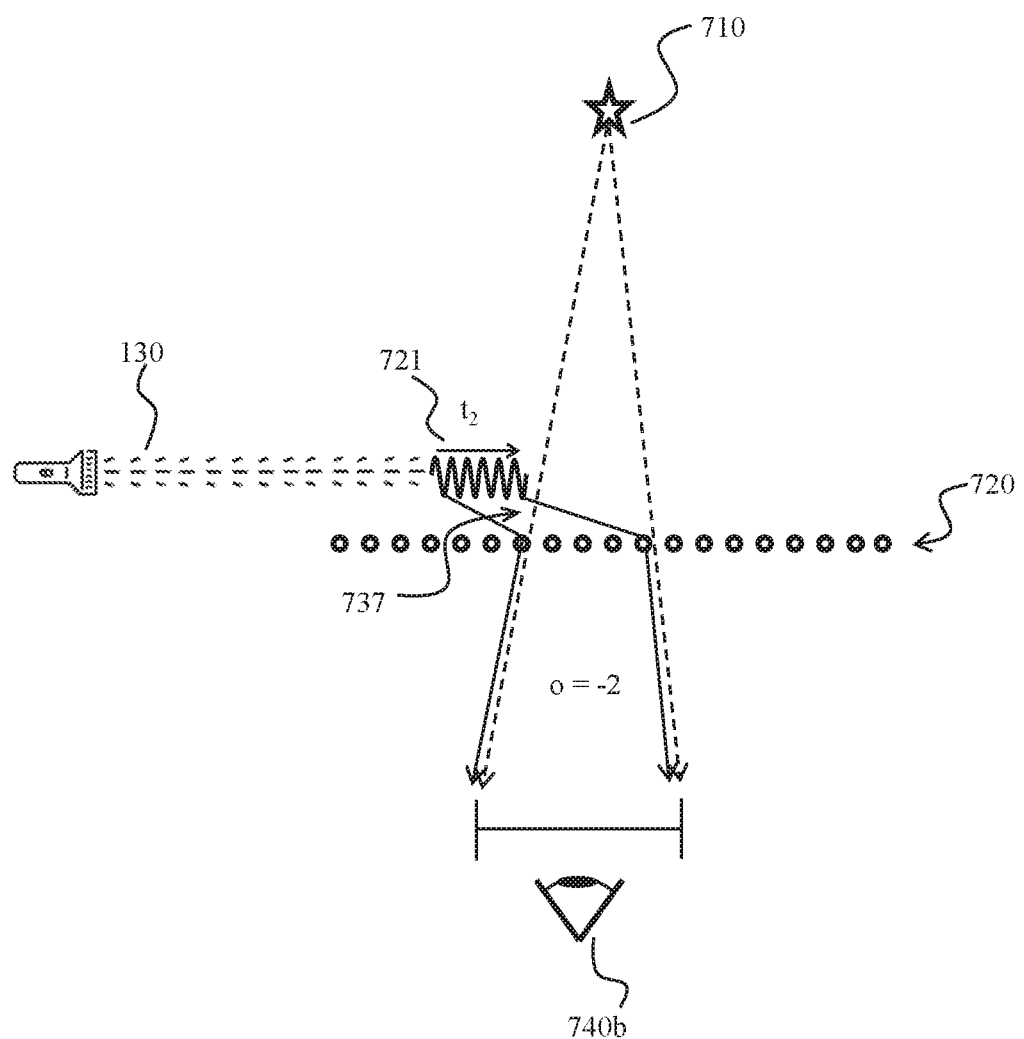
Figure 8C:
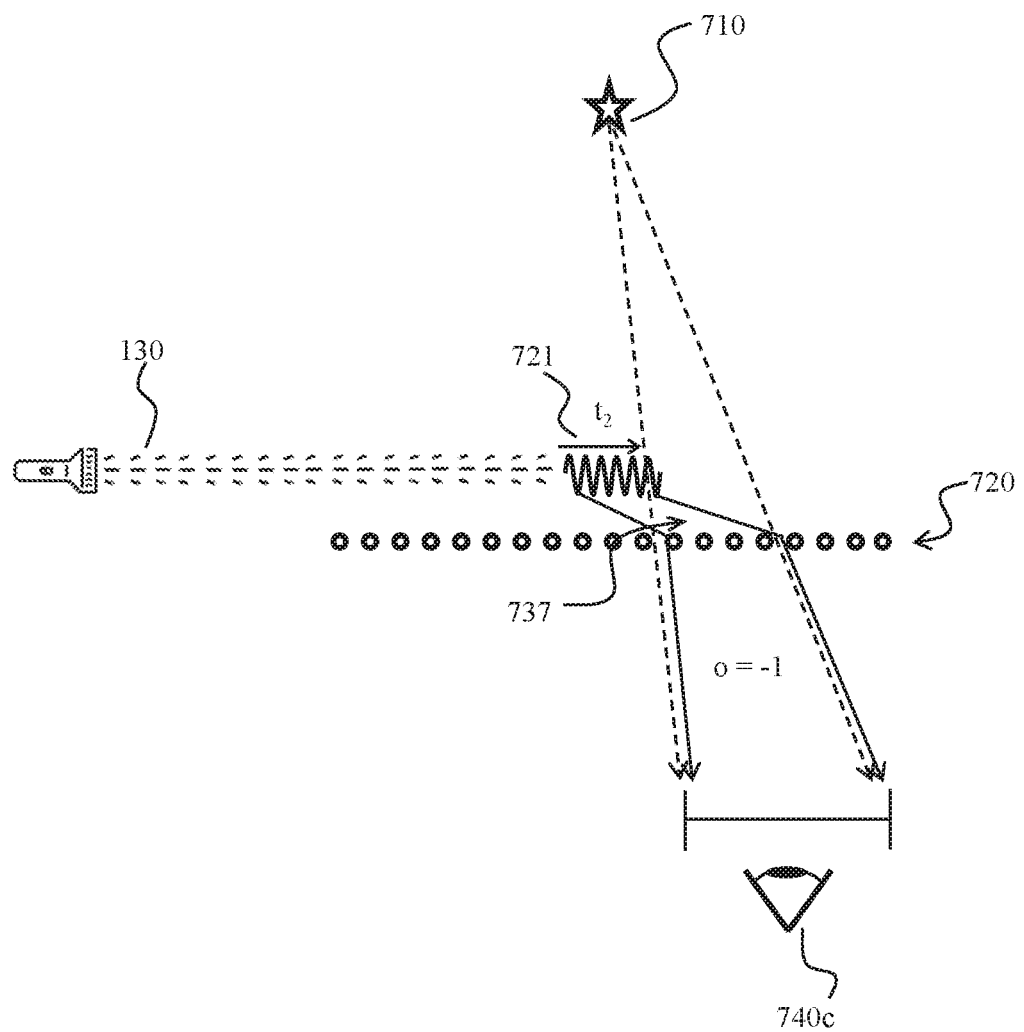

FIG. 5 shows how a near-eye display using different diffracted modes may create a wide view zone. For example, a SAW may be pulsed at a first time such that leaky light from the SAW is divided into multiple orders and one of the orders is directed toward a first view position. The same SAW may subsequently be pulsed at a second time such that leaky light from the SAW is divided into multiple orders and one of the orders is directed toward a second view position. Using the appropriate pulsing pattern (for applying input light), a user may move from the first view position to the second view position, and a virtual point may appear to the user to have remained at the same point in space, and the user may further perceive that he/she is seeing a different angle of the virtual point—as if virtual point were an actual point and the user had actually moved. FIGS. 8a-8c illustrate and explain this embodiment and phenomenon in greater detail.

FIG. 5 further shows how a near-eye display using different diffracted modes may create a wide field of view. For example, a first SAW 310 encoding a first virtual point may be pulsed at a first time such that leaky light from SAW 310 is divided into multiple orders and one of the orders is directed toward a view position. A second saw 320 may be pulsed such that leaky light from SAW 320 is divided into multiple orders and one of the orders is directed toward the same view position. This approach may be scaled to a large number of virtual points (e.g., thousands, ten thousands, hundred thousands, or more. Using the appropriate pulsing pattern (for applying input light), a user may see a wide field of view as if the virtual points were really there. FIGS. 9a-9e illustrate and explain this phenomenon in greater detail.

It should be noted that, because the pulsing/illumination speed may be much faster than a human eye is able to perceive, many pulsing events may occur but be perceived by a user as having occurred simultaneously, e.g., SAWs representing numerous virtual points may be illuminated at a very high speed, thus resulting in presentation of many orders from many SAWS to a user, the user will perceive that the orders are being presented simultaneously even though the input light is pulsing/illuminating SAWs in a serial manner.

Figure 6A:
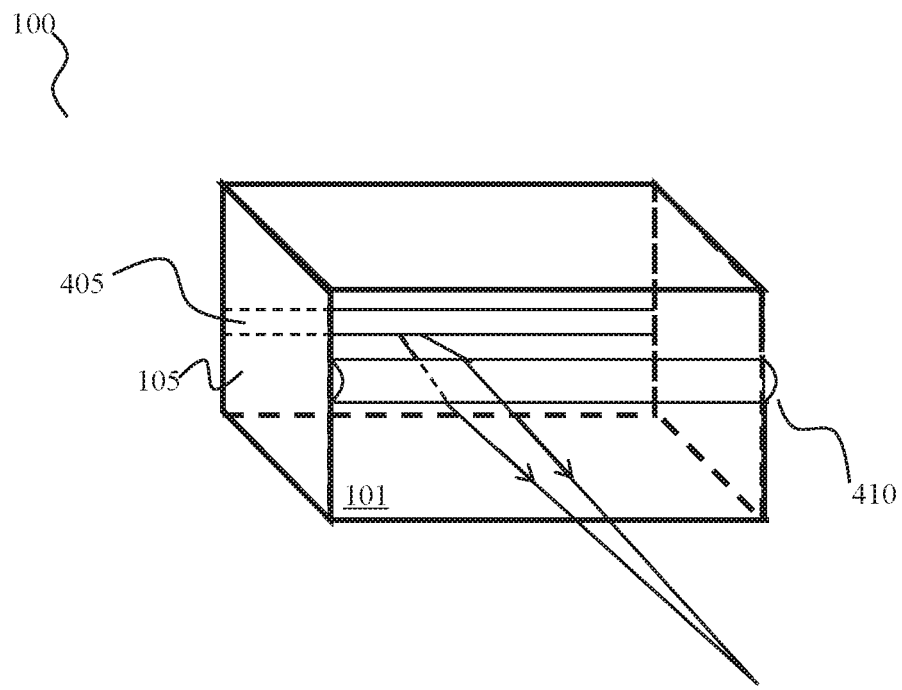
FIGS. 6a-6d show refractive structures to collimate or focus light that can be cascaded with the diffractive leaky mode structures described herein.
Figure 6B:
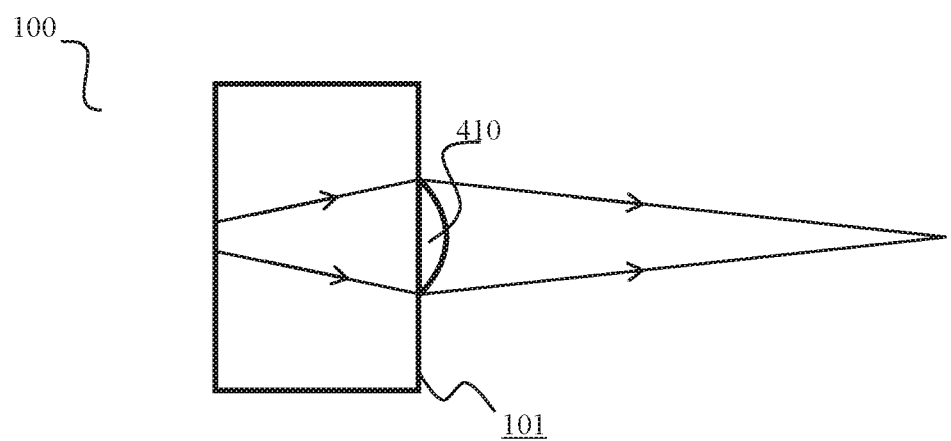
Figure 6C:
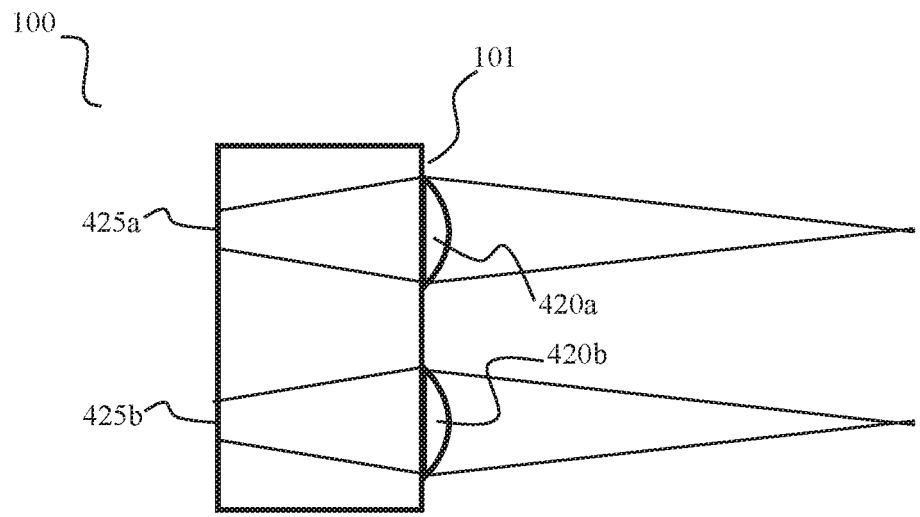
Figure 6D:
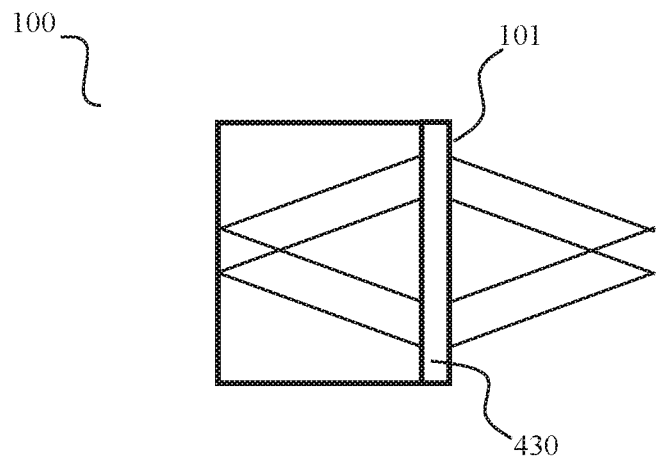

FIGS. 6a-d show alternate embodiments in which structures are placed by photolithography on the bottom surface of SMLMD 100 to further redirect light, e.g., to create a vertical focus. For example, FIG. 6a shows a bottom-angle-perspective view of SMLMD 100 with a diffuser 410 on bottom surface 101. FIG. 6b shows a side cross-section view of SMLMD 100 as shown in FIG. 6a. FIG. 6c shows a side cross-section view of SMLMD 100 wherein lenslets 420a and 420b, comprising a lenslet array, have been added to bottom 101 of SMLMD 100, and wherein each lenslet 420a and 420b may be responsible for the output of one channel, e.g., lenslet 420a may be responsible for the output of leaky mode channel 425a and lenslet 420b may be responsible for the output of leaky mode channel 425b. FIG. 6d shows a side cross-section view of SMLMD 100, wherein volume hologram 430 has been added to create focus for the overlapping output of many leaky mode channels.

Various beneficial effects can be generated by the pattern used to illuminate a SAW, i.e., the illumination pattern or pulsing pattern. A pulsing pattern generally comprises a pattern for turning input light 130 on and off. This may be referred to as e.g., chirping, pulsing, strobing, or a chirp pattern, a pulse pattern, or a strobe pattern.

In one embodiment, a pulse may be approximately 110 nanoseconds.

Figure 7A:
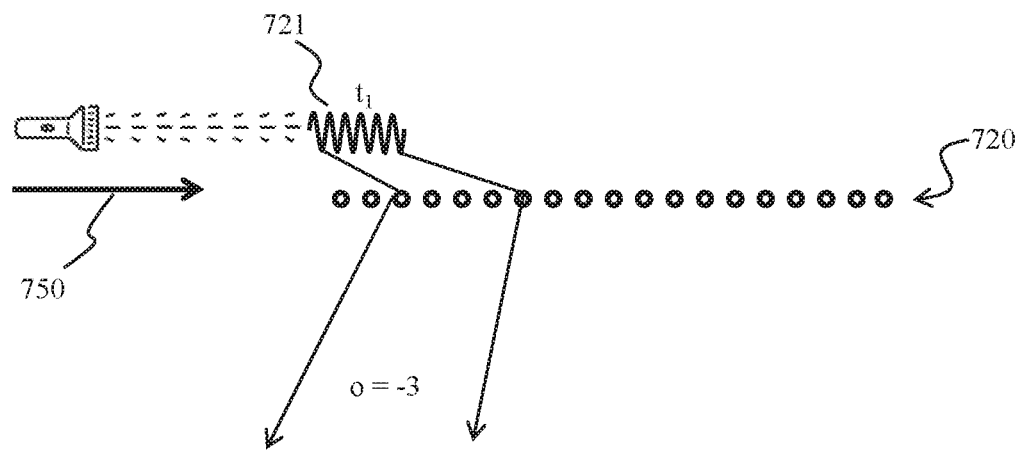
FIGS. 7a-7e show how structures divide light from an illuminated SAW into multiple orders, wherein each order comprises a different angle at which light is bent upon interaction with structures.
Figure 7B:
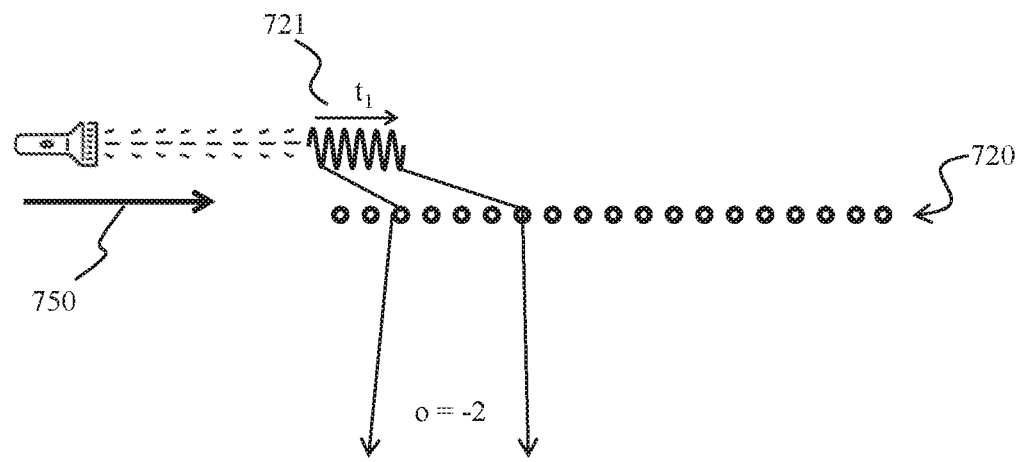
Figure 7C:
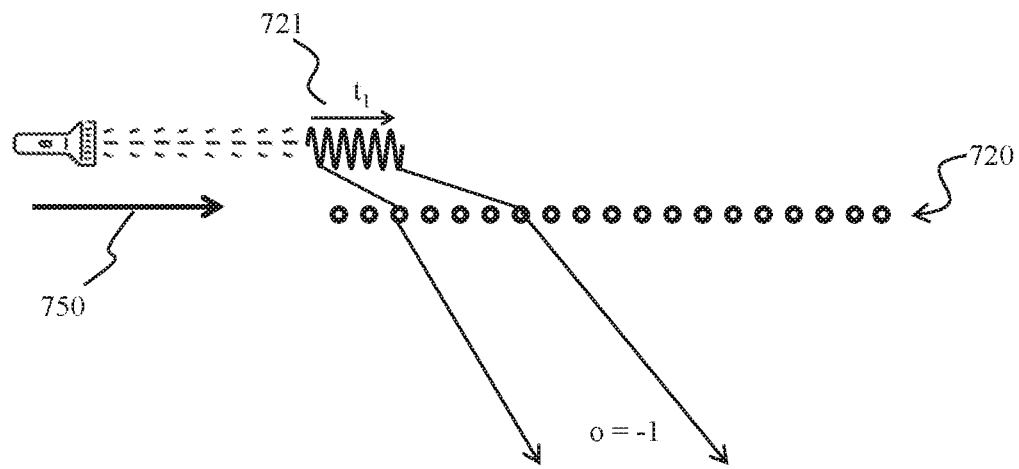
Figure 7D:
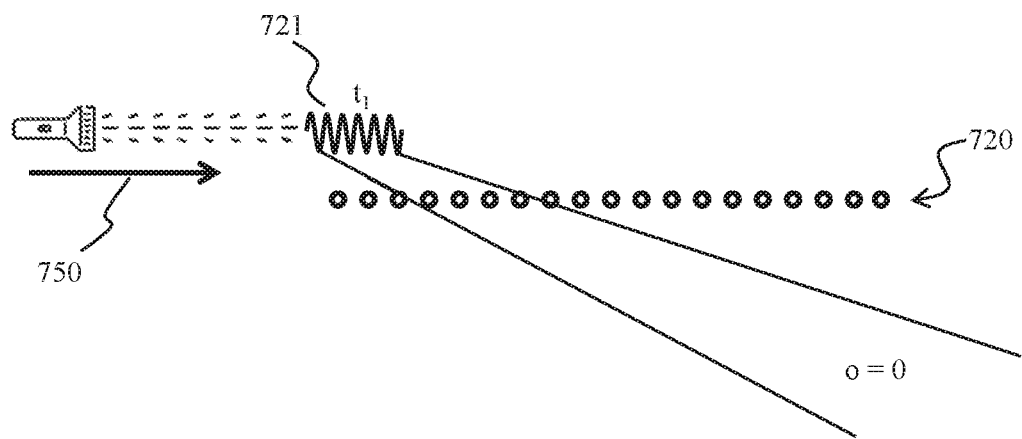
Figure 7E:
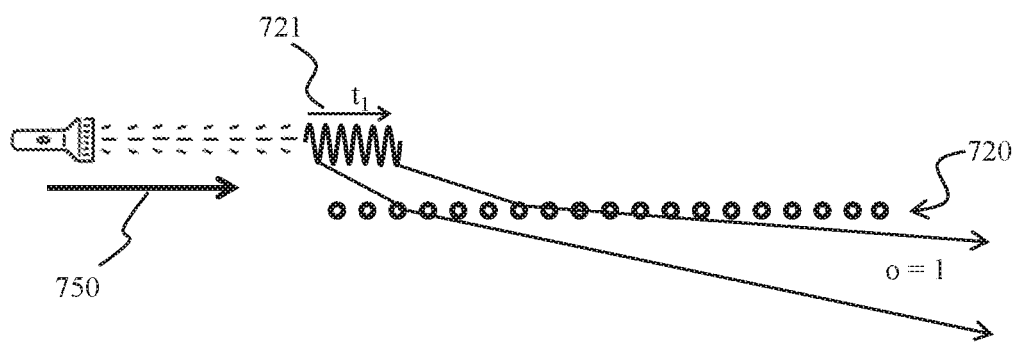

FIGS. 8a-c and 9a-d provide a detailed illustration of exemplary embodiments for providing a wide view zone and wide view field, respectively. FIGS. 7a-e illustrate how the structures, as disclosed herein, divide leaky mode light into different orders that are bent at different angles. For the sake of explanation, FIGS. 7a-e separately show multiple orders from the same pulse to the same SAW, even though in practice the orders are generated simultaneously when a SAW is pulsed. FIG. 7d shows the 0 order, i.e., the order that does not bend the leaky mode light at all. FIG. 7c shows the minus 1 order. FIG. 7b shows the minus 2 order. FIG. 7a shows the minus 3 order. FIG. 7e shows the plus 1 order. The angles at which various orders are bent may be adjusted or changed based on the pattern of structures other characteristics of a leaky mode light device system, e.g., size of the leaky mode device, distance from surface to structures, etc.)

FIGS. 8a-c show one exemplary effect that may be generated based on an arrangement of a set of structures and a chirping pattern. As shown in FIGS. 8a-c, it may be desirable to display a virtual point 710 so that it is visible at a wide view angle, e.g., at view positions 740a, 740b, and 740c, and so that it is also appears at the proper virtual location and perspective from each view position. As shown in FIG. 8a, a SAW 721, traveling from left to right, at time $t_1$ may be illuminated, pulsed, or strobed with light 130 such that the resulting leaky mode light 737 interacts with structures 720, thereby generating the minus 3 order, which is directed toward view position 740a. If, as shown in FIG. 8b, the same SAW 721 is strobed at a time $t_2$, the resulting leaky mode light 737 interacts with structures 720, thereby generating the minus 2 order, which is directed toward view position 740b. Similarly, as shown in FIG. 8c, the same SAW 721 may be strobed at a time $t_3$, and the resulting leaky mode light 737 interacts with structures 720, thereby generating the minus 1 order, which is directed toward view position 740c. In addition to making virtual point 710 visible from view positions 740a, 740b, and 740c, i.e., increasing or widening the view zone, virtual point 710 appears to the viewer to be at the same actual location, and also appears from the expected perspective or angle.

In this manner, by timing the strobing by input light 130, a wider view angle may be created, i.e., a user may be able to see virtual point 710 from position 740a, 740b, and 740c, and at the proper perspective.

In one embodiment, the strobing pattern may have awareness (e.g., through one of many sensors or other approaches known in the art) of a viewer's view position, and may determine strobing timing and frequency based on the viewer's view position. This approach may alleviate some interference that may result from orders that are directed toward more than one view position. As already described herein, because strobing can occur at a much faster rate than the perception ability of the human eye, this approach may generate an image that appears to a viewer as a stable image, even though thousands, or hundreds of thousands, or millions of virtual points may be generated serially by pulsing SAWs.

Figure 9A:
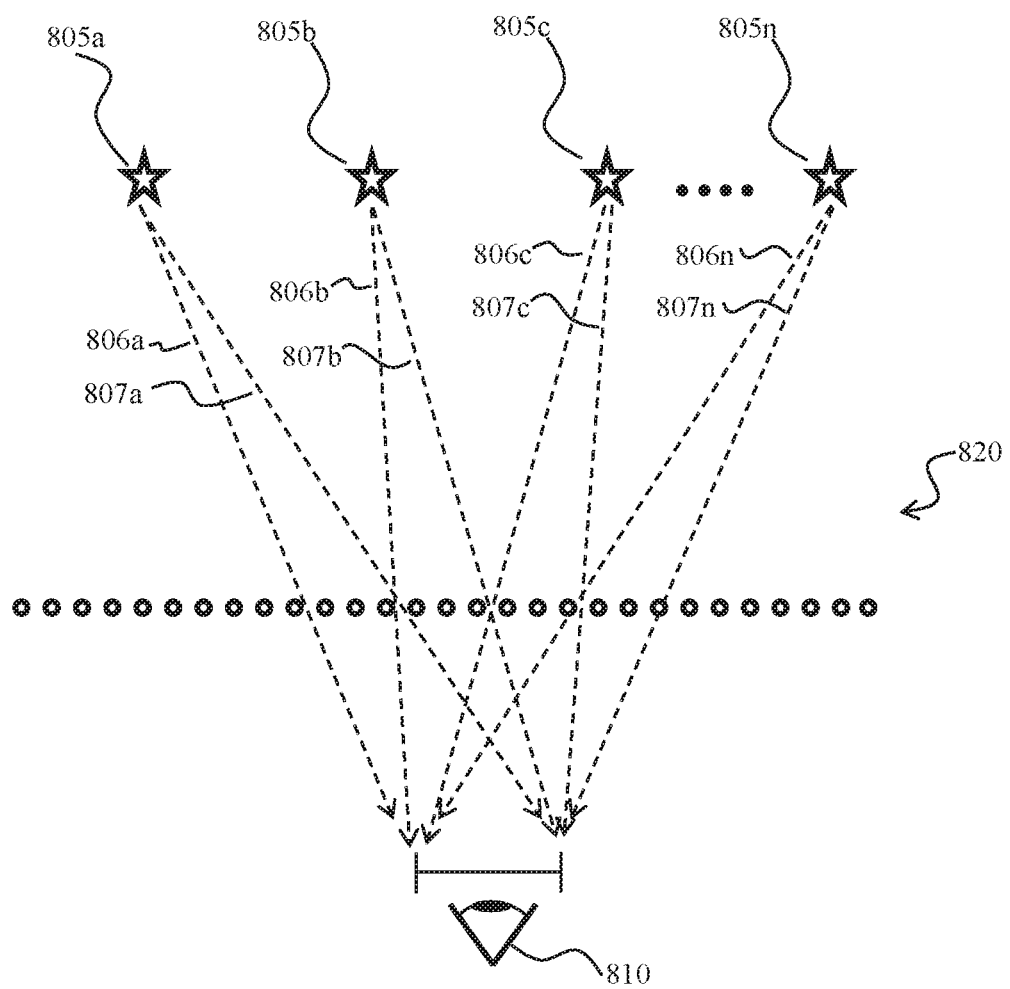
FIGS. 9a-9e show how orders from structures may be used to generate a wide field of view by strobing differing SAWs at different times.

As illustrated in FIGS. 9a-e, the system described herein may be applied to increase the view zone (e.g., the size of the viewable virtual area) available at one location. For example, FIGS. 9a-e show virtual points 805a-n. This is a simplified example for explanatory purposes. An actual implementation would likely have thousands, tens of thousands, hundreds of thousands, or millions of virtual view points, As shown in FIG. 9a, it may be desirable to display virtual points 805a-n at view position 810. View lines 806a-n and 807a-n represent perceived light, at view position 810, from virtual points 805a-n.

Figure 9B:
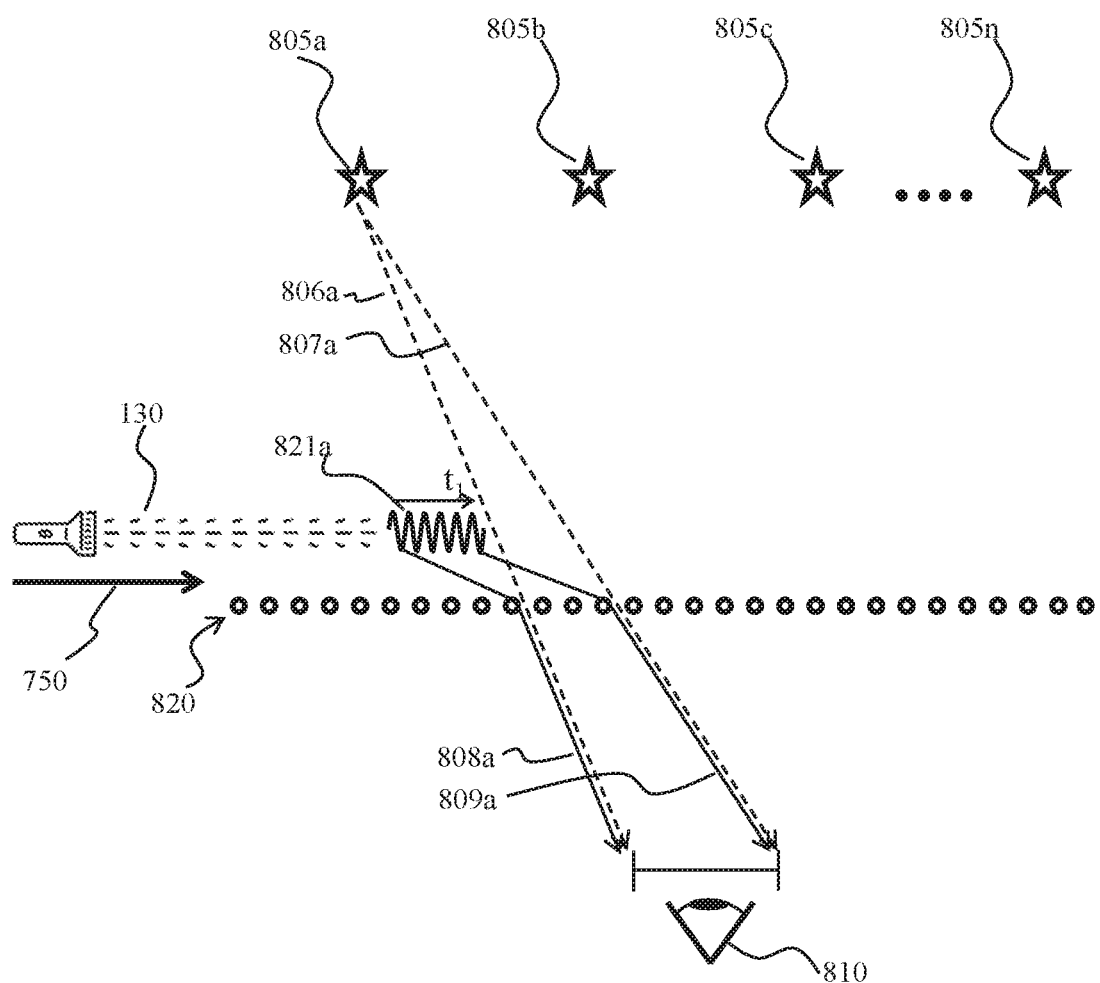
Figure 9C:
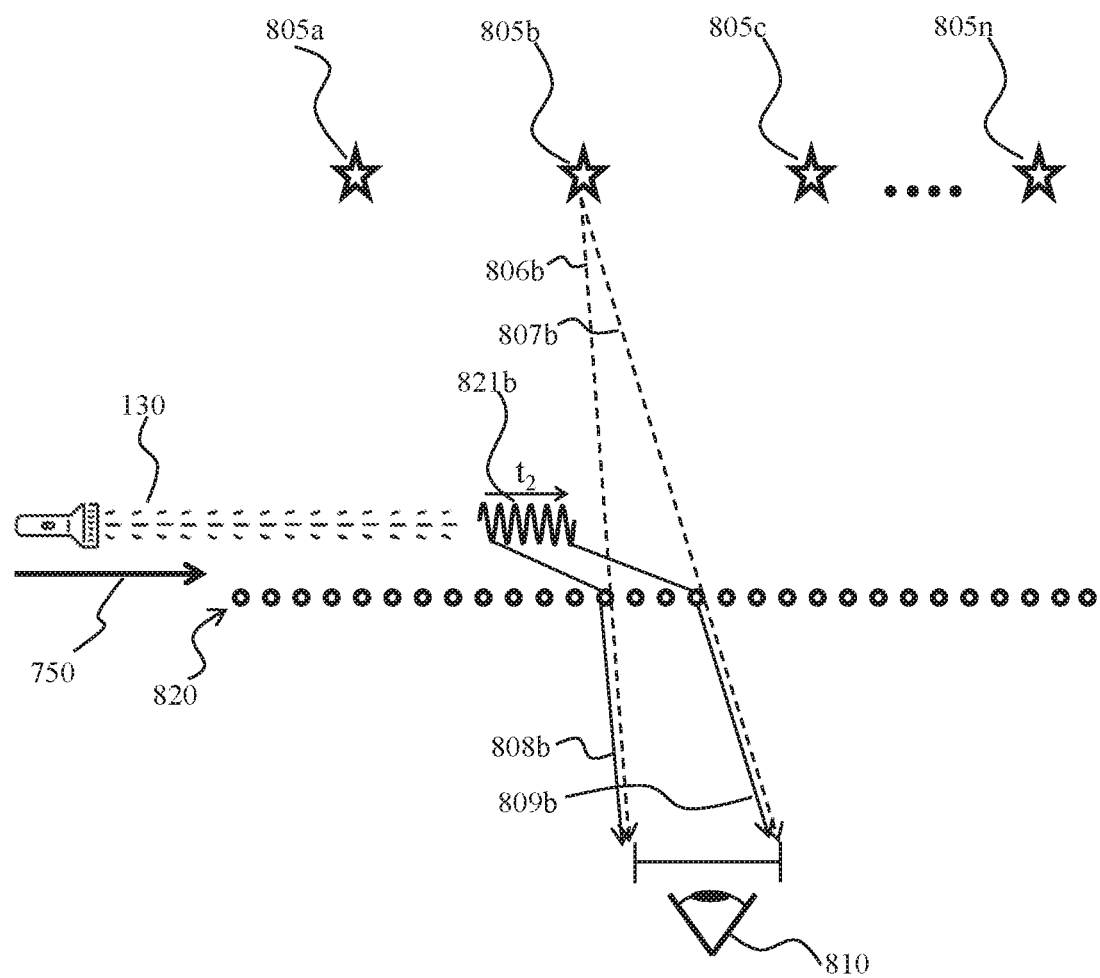
Figure 9D:
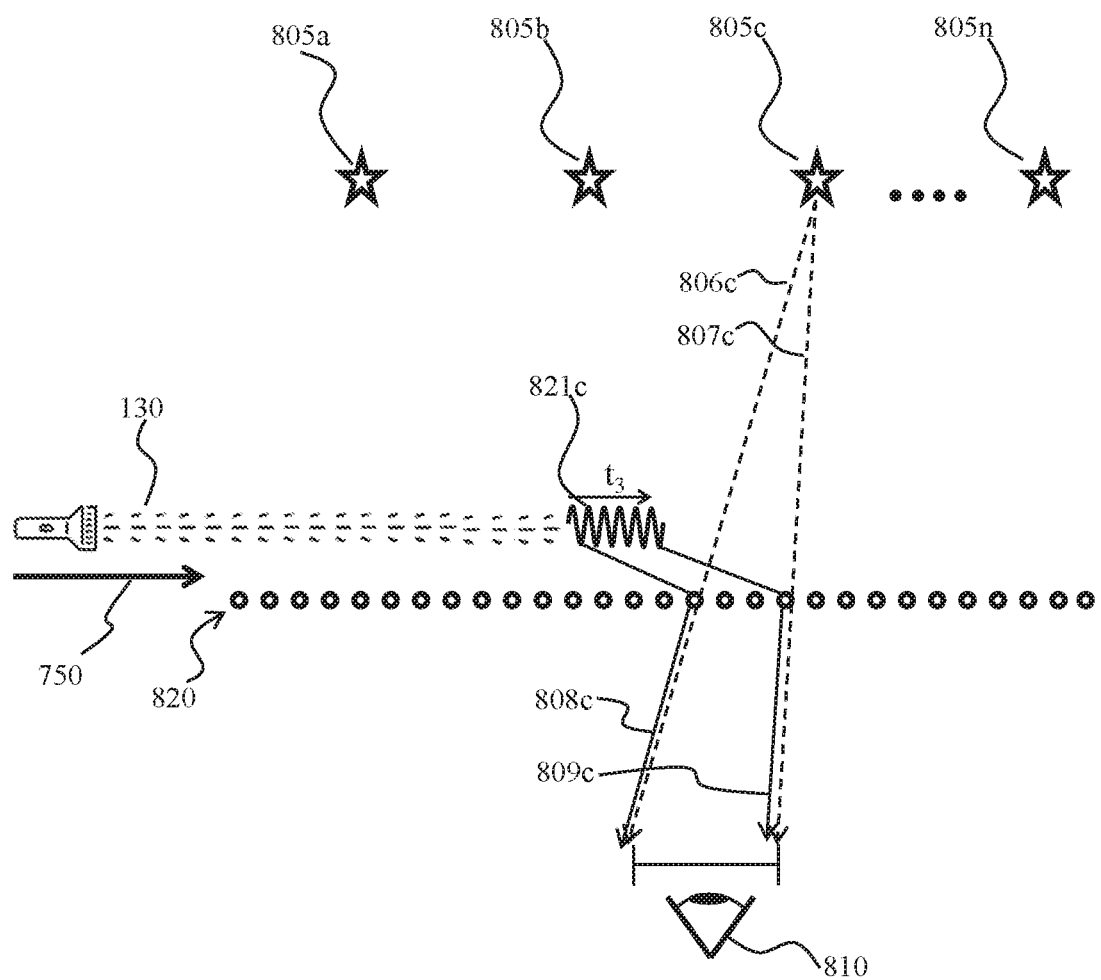
Figure 9E:
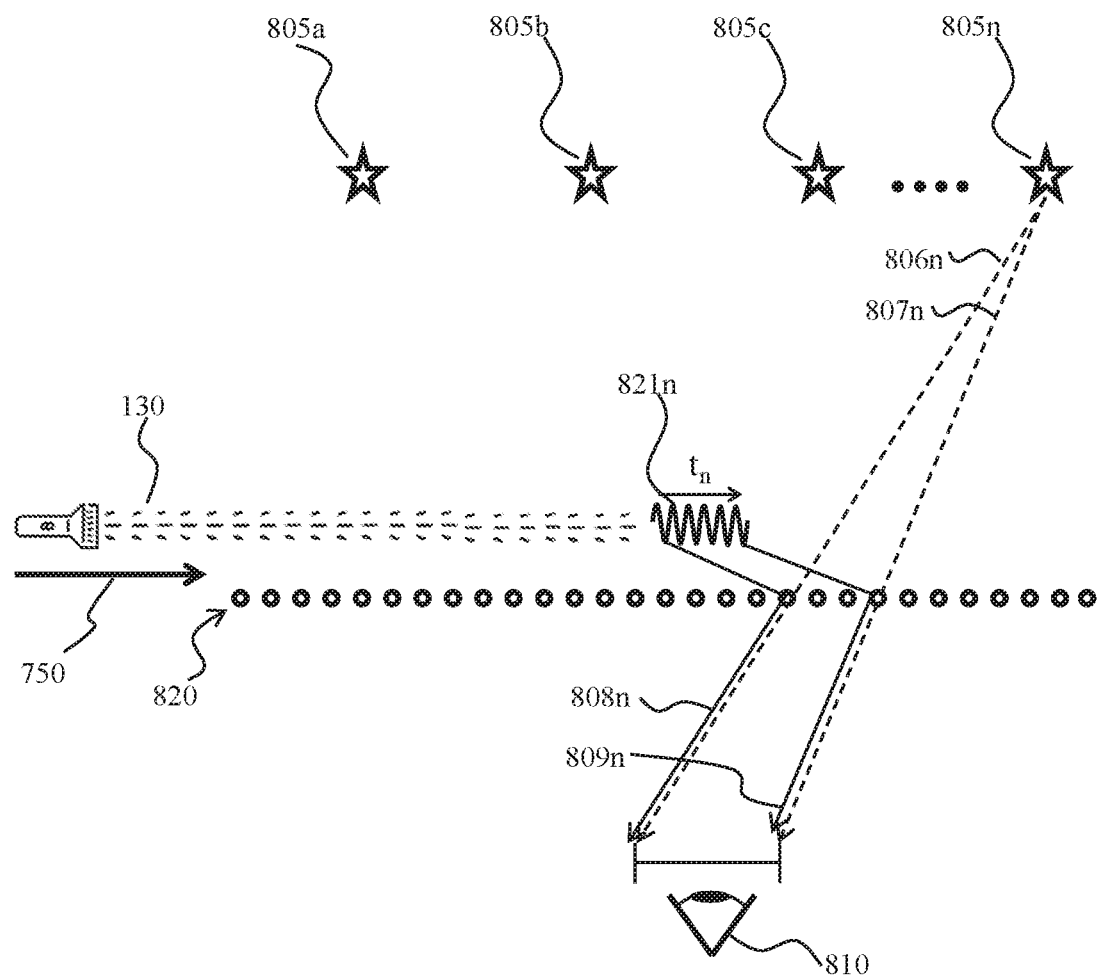

FIG. 9b shows that by pulsing SAW 821a, virtual point 805a may be displayed to a viewer at view position 810. Virtual point image bounds 806a and 807a represent the bounds of the image of virtual point 805a as perceived by a viewer at view position 810. Bounds 808a and 809a represent the bounds of the light as it actually travels from SAW 821a after SAW 821a is illuminated or strobed by input light 130. FIGS. 9c, 9d, and 9e are analogous to points 805b, 805c, and 805n, respectively. As shown in FIGS. 9b-e, by pulsing SAWs 821a-n, which are associated with virtual points 805a-n, at the appropriate times, a viewer at view position 810 will perceive virtual points 805a-n as if they were located at the actual locations shown in FIGS. 805a-n, even though the light for virtual points 805a-n is actually originating from SAWs 821a-n. Because light may be pulsed much more quickly that a human eye can perceive, and SAWs can traverse leaky mode devices much more quickly than a human eye can perceive, a user may see a wide field of view, which may appear to be stable and persistent, even though individual virtual points in the field of view are being generated serially.

As shown in FIG. 10, one exemplary method may comprise using a SMLMD to increase a view zone of a virtual image.

At step 1010, a computing device may generate or receive data comprising a representation of a virtual point.

At step 1020, the computing device may transmit the data representation of the virtual point to a transducer, which may encode the virtual point as a SAW that propagates across the surface of a leaky mode device.

At step 1030, the computing device may receive as input a view position.

At step 1040, the computing device may direct an input strobe at a first time and thereby illuminate the SAW. The pulse timing may be computed based on a pattern and/or design of structures in the leaky mode device, and based on other features of the leaky mode device, such that the light pulse results in leaky mode light that interacts with the structures, which divide the leaky mode light into orders such that at least one order is directed toward the view position.

At step 1050, the computing device may direct an input light to strobe at a second time such that one of the resulting orders is directed toward a second view position, and represents the virtual point as if at the same perceived actual location as perceived at the first view position.

As shown in FIG. 11, another exemplary method may comprise using an SMLMD to increase a view area.

At step 1110, a computing device may generate or receive data comprising a representation of a set of virtual points.

At step 1120, the computing device may transmit the data representation virtual point to a transducer, which may encode the virtual point as a first SAW that propagates across the surface of a leaky mode device.

At step 1130, the computing device may direct an input light to strobe at a first time and thereby illuminate the first SAW. The pulse timing may be computed based on a pattern and/or design of structures in the leaky mode device, and based on other features of the leaky mode device, such that the light pulse results in leaky mode light that interacts with the structures, which divide the leaky mode light into orders such that at least one order is directed toward the view position.

At step 1140, the computing device may transmit the data representation of a second virtual point to a transducer, which may encode the virtual point as a second SAW that propagates across the surface of the leaky mode device.

At step 1150, the computing device may direct an input light to strobe at a second time and thereby illuminate the second SAW. The pulse timing may be computed based on a pattern and/or design of structures in the leaky mode device, and based on other features of the leaky mode device, such that the light pulse results in leaky mode light that interacts with the structures, which divide the leaky mode light into orders such that at least one order is directed toward the same view position.

The method steps disclosed above may be performed in different orders, or with some steps omitted, or other steps added, and remain within the scope of the disclosure herein.

What is claimed is:

1. A structure-modified leaky mode device, comprising:
   a substrate;
   a SAW transducer disposed on the top of the substrate;
   a waveguide; and
   a set of non-transitory structures;
   wherein:
   the SAW transducer is configured to receive an input signal and convert the input signal into a SAW for propagation across the surface of the substrate.

2. The device of claim 1, wherein the set of structures are configured to direct light out of the bottom of the device wherein the bottom of the device is a side of the device that is opposed to the top of the device.

3. The device of claim 1, wherein the structures are configured to divide leaky mode light into multiple orders.

4. The device of claim 1, further including a computer-controlled light input device configured to pulse light to interact with a SAW.

5. The device of claim 4, further comprising a computer control module configured to transmit virtual point data to the transducer and direct the computer-controlled light input device to strobe.

6. The device of Maim 5, wherein the computer control module comprises computer-executable instructions that, when executed, cause the computer control module to:
   transmit a data representation of a virtual point to the transducer;
   direct the light input device to strobe a SAW resulting from the transducer, and which is associated with the data representation of the virtual point, at a time such that an order resulting from interaction of the structures with the leaky mode light resulting from the strobed SAW is directed toward a first view position;
   direct the light input device to strobe the SAW resulting from the transducer, and which is associated with the data representation of the virtual point; at a time such that an order resulting from interaction of the structures with the leaky mode light resulting from the strobed SAW is directed toward a second view position.

7. The device of claim 5, wherein the computer control odule comprises computer-executable instructions that, when executed, cause the computer control module to:
   transmit a data representation of a first virtual point to the transducer;
   direct the light input device to strobe a SAW resulting from the transducer; and which is associated with the data representation of the first virtual point, at a time such that an order resulting from interaction of the non-transitory structures with the leaky mode light resulting from the strobed SAW is directed toward a view position;
   transmit a data representation of a second virtual point to the transducer;
   direct the light input device to strobe a SAW resulting from the transducer; and which is associated with the data representation of the second virtual point, at a time such that an order resulting from interaction of the non-transitory structures with the leaky mode light resulting from the strobed SAW is directed toward the view position.

8. The device of claim 4, wherein the computer controlled light input device is configured to pulse light in a pulsing pattern designed to result in at least one of the following interactions with the SAW: direct light from the SAW toward one or more specific structure regions; combine orders to create high-angle information; create a wvide view zone, and create a wide view field.

9. The device of claim 1, wherein the substrate comprises lithium niobate.

10. The device of claim 1, wherein the set of non-transitory structures is at least partially laser-induced.

11. The device of claim 1; wherein the set of non-transitory structures is at least partially fabricated on the surface of the device.

12. The device of Maim 1, wherein the set of non-transitory structures comprises Bragg gratings.

13. The device of claim 1, wherein the set of non-transitory structures comprises Raman Nath gratings.

14. The device of claim 1, wherein set of non-transitory structures comprises thin gratings.

15. The device of claim 1; wherein:
   the set of non-transitory structures comprises a first grating and a second grating;
   the first grating is configured to create multiple orders and set the angular separation between the multiple orders; and
   the second grating is configured to rotate the multiple orders toward a view position.

16. The device of claim 1, wherein the set of non-transitory structures comprises a mirror array.

17. The device of claim 1, wherein the set of structures comprises at least one of the following: grating holographic structure, mirror, prism, and lens.

18. A method for displaying an image, comprising:
   obtaining a representation of a virtual point;
   transmitting the representation of the virtual point to a transducer, wherein the transducer is configured to encode the virtual point as a surface acoustic wave (SAW) for propagation across a surface of a substrate in a leaky mode device comprising non-transitory structures configured to divide leaky mode light into multiple orders;
   directing an input light to strobe at a first time and thereby illuminate the SAW, wherein the strobe at the first time is timed such that at least one of the orders resulting from interaction of first leaky mode light with the non-transitory, structures, wherein the first leaky mode light results from strobing the SAW at the first time, is directed toward a first view position; and
   directing the input light to strobe at a second time and thereby illuminate the SAW, wherein the strobe at the second time is timed such that at least one of the orders resulting from interaction of second leaky mode light with the non-transitory structures, wherein the second leaky mode light results from strobing the SAW at the second time, is directed toward a second view position.

19. The method of claim 18, further comprising determining the first time and the second time based on a view position.

20. A method for displaying an image, comprising:
   obtaining a representation of a set of virtual points;
   transmitting the representation of a first virtual point from the set of virtual points to a transducer, wherein the transducer is configured to encode the first virtual point as a first surface acoustic wave (SAW) for propagation across a surface of a substrate in a leaky mode device comprising non-transitory structures configured to divide leaky mode light into multiple orders;
   transmitting the representation of a second virtual point from the set of virtual points to the transducer, wherein the transducer is configured to encode the second virtual point as a second surface acoustic wave (SAW) for propagation across the substrate surface of the leaky mode device;

directing an input light to strobe at a first time and thereby illuminate the first SAW, wherein the strobe at the first time is timed such that at least one of the orders resulting from interaction of first leaky mode light with the non-transitory structures, wherein the first leaky mode light results from strobing the first SAW at the first time, is directed toward a view position; and directing the input light to strobe at a second time and thereby illuminate the second SAW, wherein the strobe at the second time is timed such that at least one of the orders resulting from interaction of second leaky mode light with the non-transitory structures, wherein the second leaky mode light results from strobing the second SAW at the second time, is directed toward the view position.

\* \* \* \* \*